United States Patent [19]
Heitele et al.

[11] Patent Number: 5,654,971
[45] Date of Patent: Aug. 5, 1997

[54] ELECTRONIC CIRCUIT OR BOARD TESTER AND METHOD OF TESTING AN ELECTRONIC DEVICE

[75] Inventors: Winfried Heitele; Stefan Zschiegner, both of Boeblingen, Germany

[73] Assignee: Hewlett-Packard Company, Palo Alto, Calif.

[21] Appl. No.: 686,794

[22] Filed: Jul. 26, 1996

[30] Foreign Application Priority Data

Aug. 10, 1995 [EP] European Pat. Off. ............ 95112576

[51] Int. Cl.[6] .................................................. G01R 31/28
[52] U.S. Cl. ............................................ 371/24; 371/22.1
[58] Field of Search ........................... 371/22.1, 24, 22.2, 371/25.1, 27; 395/183.01; 324/158.1

[56] References Cited

U.S. PATENT DOCUMENTS 4,652,814  3/1987  Groves et al. .
5,001,418  3/1991  Posse et al. .
5,025,205  6/1991  Mydill et al. .
5,513,188  4/1996  Parker ................................. 371/22.3

OTHER PUBLICATIONS

European Search Report, EP 95 11 2576, 5 Feb. 1996.

*Primary Examiner*—Vincent P. Canney

[57] ABSTRACT

This invention relates to electronic circuit testing and more particularly to an apparatus and a method utilizing enhanced test data compression techniques. An electronic circuit or board tester according to the invention includes one tester circuit with a combination of a sequencer and a vector-sequencer-memory per pin. The test-data-sequence to be applied to a pin of a device under test is compressed in order to save memory space.

14 Claims, 5 Drawing Sheets

| Clk | Qd | Qc | Qb | Qa | VECTOR |
|---|---|---|---|---|---|
| 1 | 0 | 0 | 0 | 0 | 1 |
| 1 | 0 | 0 | 0 | 1 | 2 |
| 1 | 0 | 0 | 1 | 0 | 3 |
| 1 | 0 | 0 | 1 | 1 | 4 |
| 1 | 0 | 1 | 0 | 0 | 5 |
| 1 | 0 | 1 | 0 | 1 | 6 |
| 1 | 0 | 1 | 1 | 0 | 7 |
| 1 | 0 | 1 | 1 | 1 | 8 |
| 1 | 1 | 0 | 0 | 0 | 9 |
| 1 | 1 | 0 | 0 | 1 | 10 |
| 1 | 1 | 0 | 1 | 0 | 11 |
| 1 | 1 | 0 | 1 | 1 | 12 |
| 1 | 1 | 1 | 0 | 0 | 13 |
| 1 | 1 | 1 | 0 | 1 | 14 |
| 1 | 1 | 1 | 1 | 0 | 15 |
| 1 | 1 | 1 | 1 | 1 | 16 |
| 1 | 0 | 0 | 0 | 0 | 17 |
| 1 | 0 | 0 | 0 | 1 | 18 |
| 1 | 0 | 0 | 1 | 0 | 19 |
| 1 | 0 | 0 | 1 | 1 | 20 |

FIG. 3

```
                        START
                          |
TEST-DATA-SEQUENCE:     101X101X101X101X11111111101010101010101
CHECKED DATA STRING:    10
CONSISTENCY:            ^^
```
FIG. 4A

```
                        START
                          |
TEST-DATA-SEQUENCE:     101X101X101X101X11111111101010101010101
CHECKED DATA STRING:    101
CONSISTENCY:            ^^^
```
FIG. 4B

```
                        START
                          |
TEST-DATA-SEQUENCE:     101X101X101X101X11111111101010101010101
CHECKED DATA STRING:    101X
CONSISTENCY:            ^^^^^^^^^^^^^^^
```
FIG. 4C

```
                                        START
                                          |
TEST-DATA-SEQUENCE:     101X101X101X101X11111111101010101010101
CHECKED DATA STRING:                      1
CONSISTENCY:                              ^^^^^^^^^^
```
FIG. 4D

```
                                                    START
                                                      |
TEST-DATA-SEQUENCE:     101X101X101X101X11111111101010101010101
CHECKED DATA STRING:                                  01
CONSISTENCY:                                          ^^^^^^^^^^^
```
FIG. 4E

TEST-DATA-
SEQUENCE:        101X000101X1111101X101010101X000101X1010101X010
CONSISTENCY:     ^^^^    ^^^^    ^^^^    ^^^^       ^^^^    ^^^^
MOST FREQUENT    101X
DATA STRING:

COMPRESSED       T000T1111T101010T000T1010T010
TEST-DATA-
SEQUENCE:

FIG. 5

ELECTRONIC CIRCUIT OR BOARD TESTER AND METHOD OF TESTING AN ELECTRONIC DEVICE

BACKGROUND OF THE INVENTION

The invention relates in general to electronic circuit testing and more particularly to an apparatus and a method utilizing enhanced test data compression techniques.

Electronic circuits have become more and more complex and appropriate circuit testers need more and more functionality in order to be able to perform a sufficient test.

As the electronic circuits to be tested comprise more and more electrical connections, such as pins, the equipment needed for the functional test of an electronic circuit increases significantly. Furthermore, there is a need to modify the test data or test-data-sequences to be applied to the electrical connections of an electronic circuit under test or a board with several integrated circuits to be tested. Such modification parameters of the signals to be applied to or received from a device under test (DUT) are voltage, frequency, duty cycle etc.

An electronic circuit or board tester should be easily adaptable to the test of various electronic circuits or boards having different numbers of electrical connections and functionality. Test parameters should be easily programmable. Each DUT comprises several input and output electrical connections, such as pins. An electronic circuit or board tester applies digital signal patterns to the electrical connections of the DUT being created by the chip designer of the DUT, for example by CAE tools, taking the specifications of the respective DUT into account. Digital output signals or digital patterns generated by the DUT are compared with a signal pattern of the same DUT having full functionality.

As an electronic circuit or board tester comprises a large quantity of electronic memories, such as expensive RAMs, there is a need to reduce the amount of memories and/or memory capacity needed for carrying Gut a functionality test on various electronic circuits or boards, such as those comprising integrated circuits (ICs).

From U.S. Pat. No. 4,652,814 of the applicant, it is known to analyze a test matrix with regard to redundancy. The test matrix describes the test-data-sequences or test data being received from or supplied to each electrical connection of a DUT at each clock cycle. Each column of the test matrix describes the test signal being applied to one electrical connection of the DUT at different clock cycles. Each row of the test matrix describes the test signal at all electrical connections or pins of the DUT during one clock cycle. A row of the test matrix is called a test vector and an element of the test matrix is called a segment of a test vector.

U.S. Pat. No. 4,652,814 proposes to check the test matrix with regard to identical test vectors. In case two or more identical test vectors exist, such a test vector is stored only once in the memory of the circuit tester. All other test vectors being non-identical with other test vectors are also stored in the memory of the circuit tester, such as in one or more RAMs. Sequencing of this data is controlled by a single sequencer which provides to these RAMs the address of the data vector to be utilized at any given time.

From U.S. Pat. No. 5,402,427 of the applicant, it is known to use a set of vector storage units each storing a segment of a test vector. In case that one test vector comprises two or more identical segments, this segment is stored only once. If for example the test data (segment) at pin 1 and pin 2 are the same at the same clock cycle, this segment is stored only once. Furthermore, U.S. Pat. No. 5,402,427 proposes to use several sequencers. It will be understood that a combination of a vector storage unit and an associated sequencer, each combination working independently except with regard to the same clock signal, cannot be used. Otherwise identical segments would have to be stored in more than one vector storage unit each being associated with a different electrical connection or pin of the DUT.

When using a modular circuit or board tester with a vector storage unit and an associated sequencer per electrical connection or pin of a DUT, there is a need for an electronic circuit or board tester having another concept. Further there is a need for a different method of testing an electronic device (DUT).

SUMMARY OF THE INVENTION

The invention provides an electronic circuit or board tester for testing an electronic device (DUT) comprising a plurality of tester circuits, each comprising a conductor for providing an electrical connection to said electronic device to be tested;

a first memory storing at least a compressed test-data-sequence;

a sequencer is connected to said first memory via an address bus and a data bus controlling decompression of said compressed test-data-sequence and the transfer of said decompressed test-data-sequence to said electronic device or to a first comparator comparing response data of said electronic device with said decompressed test data;

each tester circuit is in an electrical connection with an electrical connection of said electronic device to be tested;

a clock means for applying a timing signal to said sequencer.

Furthermore, the invention provides a method of testing an electronic device (DUT) comprising a first step in which a decompressed test-data-sequence to be applied to one electrical connection of said electronic device to be tested is compressed by a data processor generating sequencer instructions and a compressed test-data-sequence;

a second step in which said compressed test-data-sequence and said sequencer instructions of said sequencer are stored in at least a first memory being each connected with said sequencer via an address bus and a data bus;

a third step in which said sequencer is operated by said sequencer instructions to decompress said compressed test-data-sequence;

a fourth step in which said decompressed test-data-sequence is transferred to said electrical connection of said electronic device to be tested or to a comparator comparing response data of said electronic device with said decompressed test-data-sequence.

The electronic circuit or board tester according to the invention has a modular concept comprising a plurality of tester circuits. Each tester circuit is associated with only one electrical connection, such as a pin of an electronic device to be tested and comprises a combination of a memory, such as a RAM, and a sequencer. Each tester circuit and thus each combination of a memory and a sequencer works independently of the other of the combinations, except for the timing signal. The sequencer of each tester circuit is connected with a first memory via an address bus and a data bus. The data processor checks each test-data-sequence to be transferred to each electrical connection or pin of the DUT or to a first comparator independently from the other test-data-sequences with regard to a data string being repeatedly existing in the test-data-sequence to be applied to the specific electrical connection or pin.

The invention proposes to use a separate sequencer per pin and to compress each test-data-sequence per pin. The data processor checks whether each test-data-sequence of the respective pin (in terms of a test matrix this is a column) comprises a data string being repeatedly existing in the test-data-sequence to be applied to a certain pin or to be transferred to a comparator comparing a response signal of the device under test with the test-data-sequence. The data processor generates sequencer instructions for each sequencer per pin and a compressed test-data-sequence per pin. The sequencer instructions and the compressed test-data-sequence of each pin are stored in one or more memories, such as RAMs, of the tester circuit associated with the respective pin or electrical connection of the electronic device to be tested. A clock means applies a timing signal to each of all tester circuits. During a test each sequencer is operated by its respective sequencer instructions generated from the data processor and stored in a memory of the same tester circuit. Each sequencer decompresses the associated test-data-sequence of its associated pin or electrical connection of the device under test and generates a decompressed test-data-sequence being transferred to the associated pin of the DUT or to a comparator of the tester circuit being in connection with the respective pin of the DUT and comparing the decompressed test-data-sequence with the response signal at the respective pin of the DUT.

According to a first embodiment of the invention a data string being repeatedly existing in a test-data-sequence of the respective pin is stored only once in the memory of the circuit tester being associated with the respective pin. All other data strings of a test-data-sequence of the respective pin comprising no redundancy are also stored in a memory of the tester circuit being associated with the respective pin. The stored sequencer instructions comprise an instruction to repeat the only once stored data string whenever necessary to generate a test-data-sequence on the basis of the compressed test-data-sequence.

According to a second embodiment of the invention the sequencer instructions per pin comprise at least two access instructions to load the only once stored data string being repeatedly existing sequentially in a memory of the sequencer being associated with the respective pin.

According to a third embodiment of the invention the electronic circuit or board tester comprises a second comparator. Prior to storing a data string being repeatedly existing in a test-data-sequence of a pin, and the storage of the sequencer instruction or sequencer instructions to repeat a data string whenever necessary to generate a test-data-sequence, the second comparator compares whether the storage needs more memory space than the storage of the decompressed repeatedly existing data strings. In case that the decompressed repeatedly existing data strings need less memory space to be stored, the data string being repeatedly existing and the sequencer instruction or sequencer instructions to repeat said data string are not stored in the memory of the tester circuit. Instead a test-data-sequence of the specific pin is stored which comprises the repeatedly existing data strings.

According to a fourth embodiment of the invention, each sequencer of each tester circuit comprises a sequencer storage unit to store a part of the compressed test-data-sequence, a sequencer directory and a sequencer controller controlling the decompression of a compressed test-data-sequence. The sequencer controller is operated and programmable by the sequencer instructions being stored in a memory of the tester circuit for the specific pin of the device under test.

In a method of testing an electronic device (DUT) according to the invention a decompressed test-data-sequence to be applied to one specific electrical connection, such as a pin, of the electronic device to be tested, is compressed by a data processor generating one or more sequencer instructions and a compressed test-data-sequence in a first step. In a second step the compressed test-data-sequence of the specific pin and the sequencer instructions for the specific sequencer are stored in one or more memories of the circuit tester. Each of the memories, such as RAMs, are connected with the specific sequencer of the tester circuit via an address bus and a data bus. In a third step the sequencer of the tester circuit is operated by the sequencer instructions and decompresses the compressed test-data-sequence of the specific pin. In a fourth step the decompressed test-data-sequence of the specific pin is transferred to the specific pin or another electrical connection of the electronic device to be tested or to a comparator comparing response data received from the specific pin of the electronic device under test with the decompressed test-data-sequence of the specific pin.

In a first embodiment of the method of testing an electronic device, each test-data-sequence or some are checked with regard to a data string being repeatedly existing in the specific test-data-sequence of the associated pin. Such data string is stored only once or at least less times than existing in one or more memories of the tester circuit being associated with the specific pin of the device under test.

In a second embodiment of the method according to the invention a data string being repeatedly existing in a test-data-sequence of a specific pin of the DUT is eliminated from said test-data-sequence and an appropriate sequencer instruction or sequencer instructions are added to the already existing sequencer instructions controlling the operation of said sequencer, which generates the associated decompressed test-data-sequence when loading the compressed test-data-sequence and being operated by the sequencer instructions. Instead of adding an appropriate sequencer instruction or sequencer instructions, the already existing sequencer instructions could be modified accordingly. The elimination of the data string being repeatedly existing in the test-data-sequence and the generation of the appropriate sequencer instruction or instructions is carried out by a data processor.

In a third embodiment of the method according to the invention, a data string being repeatedly existing in a test-data-sequence of the associated pin or electrical connection of the device under test, is substituted by one or more access instructions. Such compressed test-data-sequence of the associated pin is stored in one or more memories of the tester circuit being associated with a specific pin of the device under test. The data string being repeatedly existing is also stored in one or more memories of the tester circuit. During decompression of the compressed test-data-sequence a sequencer of the circuit tester loads the compressed test-data-sequence sequentially and checks the existence of the access instructions. In case of the existence of an access instruction, the sequencer loads the stored data string and inserts the data string in order to obtain the former decompressed test-data-sequence to be applied to one electrical connection or pin of the electronic device to be tested or to a comparator comparing response data from the specific pin of the electronic device under test with the decompressed test-data-sequence.

In a further embodiment of the method according to the invention, the electronic circuit or board tester comprises a second comparator, checking whether the storage of the one or more sequencer instructions to generate the repeated data strings and the repeatedly existing data string need more memory space to be stored than necessary for storing the repeatedly existing data strings. In case that the repeatedly existing data strings need less or the same memory space, the repeatedly existing data strings are stored in one or more memories of the associated circuit tester for the specific pin of the device under test and the one or more sequencer instructions to generate the repeated data strings are not stored. Otherwise the one or more sequencer instructions and the data string being repeatedly existing is stored.

It is understood and expressly noted that the invention relates to all useful and novel combinations of the above disclosed features, whether alone or in any other arbitrary combination. Furthermore, all cited advantages can be seen as objects solved by the invention in its entirety.

BRIEF DESCRIPTION OF THE DRAWINGS

FIG. 3 is a table showing 20 test vectors of a binary counter (DUT) to explain a method of compression of a test-data-sequence;

FIGS. 4A–E show the compression of a test-data-sequence by compressing identical data strings in it which follow each other immediately;

FIG. 5 shows the compression of another test- data-sequence by compressing identical data strings in it which do not follow each other immediately.

FIG. 1 shows a tester circuit 10 to transfer a decompressed test-data-sequence to an electrical input connector 18 of an electronic device (DUT) to be tested or to a comparator 14 in case that a circuit tester 10 is connected with an electrical output connector of the electronic device (DUT) to be tested.

Figure 1:
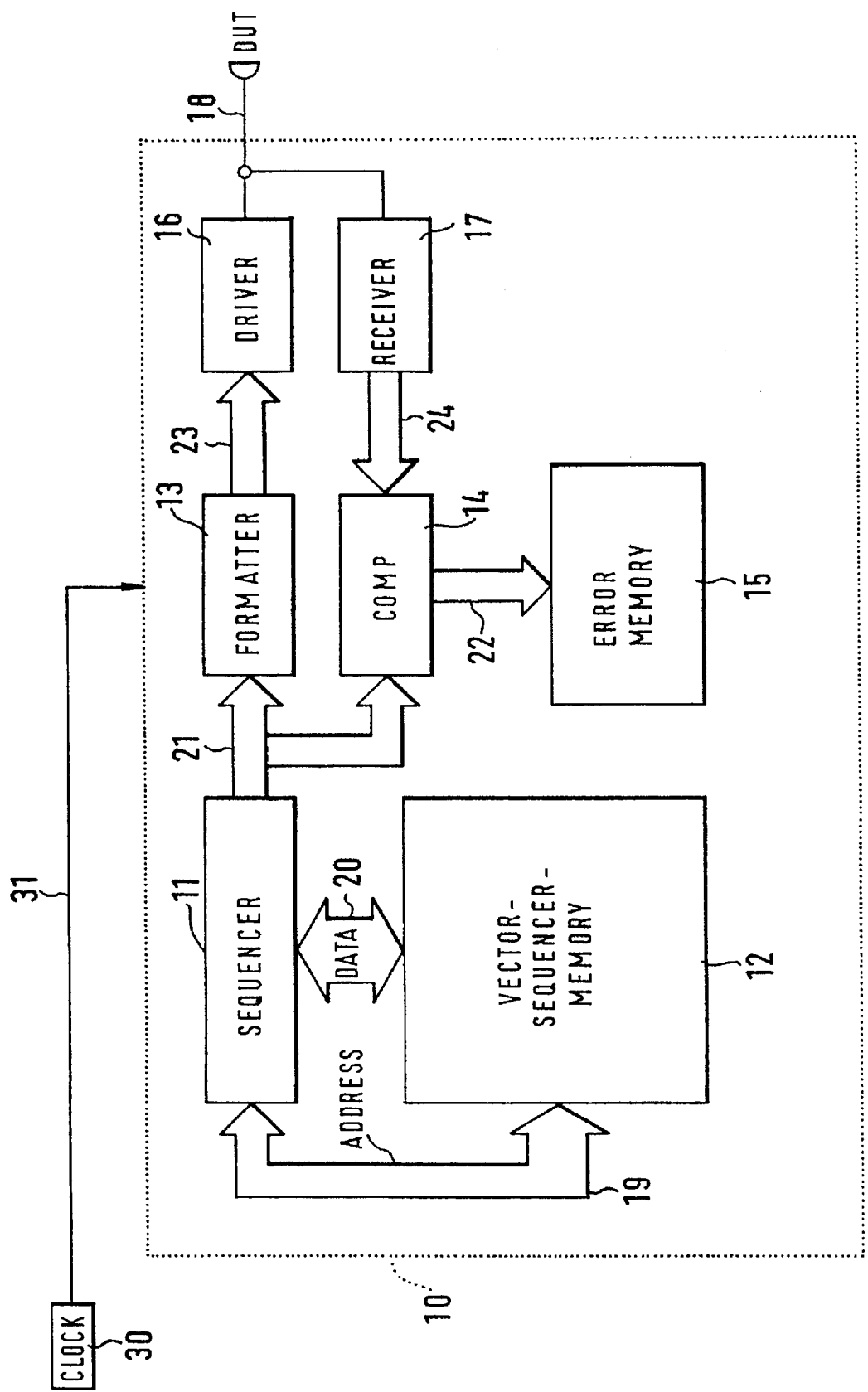
FIG. 1 is a block diagram of a tester circuit of an electronic circuit or board tester for the test of an electrical connection, such as a pin, of an electronic device (PUT) to be tested.

The electronic circuit 10 comprises a sequencer 11, such as a microprocessor being operated with software, a vector-sequencer-memory 12, such as a RAM, a formatter 13, a comparator 14, a driver 16, a receiver 17 and an error memory 15. A clock means 30 is electrically connected with each of the electronic circuits of the tester circuit 10 and which need a clock signal for their proper operation (for better understanding the electrical connections are not shown in detail). The sequencer 11 is connected via an address bus 19 and a data bus 20 with the vector- sequencer-memory 12.

In the memory 12, such as a RAM, a test-data-sequence to be applied to the electrical connection or pin 18 of the device under test (DUT) in decompressed form is stored in a compressed format. Furthermore, in the memory 12 sequencer instructions for sequencer 11 are stored. During the test clock means 31 trigger each electronic circuit of the electronic tester circuit and the sequencer loads parts of the compressed test-data-sequence and sequencer instructions into a sequencer storage unit (not shown) from memory 12 via the data bus 20. The sequencer instructions cause a sequencer controller (not shown) to address the relevant portions of the memory 12 and the compressed test-data-sequence is loaded sequentially in the sequencer storage unit and is decompressed by the sequencer to the test-data-sequence.

In case that the electrical connection 18 of the device under test is an input pin, the decompressed test-data-sequence is transferred via a bus 21 to a formatter 13 and from the formatter 13 via a bus 23 to a driver 16. The formatter 13 and the driver 16 modify the decompressed test-data-sequence with regard to the specific operation conditions of the DUT.

In case that the electrical connection 18 is an output pin of the device under test, the response-data-sequence on the output pin 18 is transferred to a receiver 17 and forwarded to a comparator 14 via a bus 24. Instead of forwarding the decompressed test-data-sequence to the formatter. 13 the test-data-sequence is transferred to the comparator 14 via the bus 21. In case that the response-data-sequence of the output pin 18 of the device under test (DUT) is not the same as the test-data-sequence generated by the sequencer 11, the comparator 14 writes in error memory 15 which bits at the same place in those sequences were the same and which bits were not the same.

The use of several tester circuits 10 allows to configurate an electronic circuit or board tester having a modular concept and being easily adaptable for the test of various electronic devices, such as integrated circuits (ICs), boards with electronic devices or ICs. Each of such tester circuits 10 can be used in connection with an output pin or an input pin of the device under test (DUT). It will be understood that also a tester circuit can be used which does not comprise a comparator, a receiver and an error memory if only used in connection with an input pin of the DUT. On the other hand a circuit tester which does not comprise formatter 13 and driver 16 can be used in connection with an output pin of the DUT.

Figure 2:
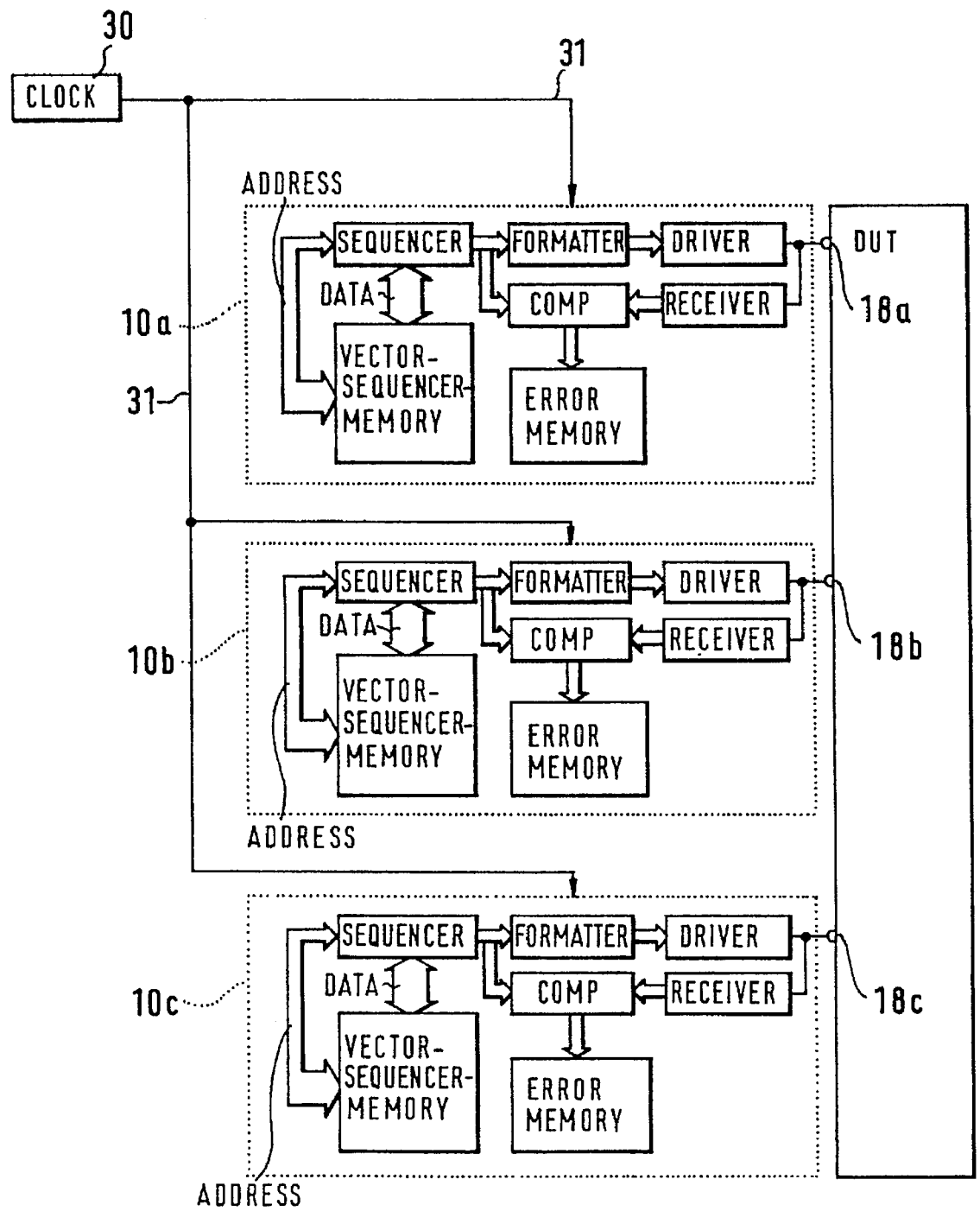
FIG. 2 is a block diagram of a modular electronic circuit or board tester comprising three tester circuits of the same kind each being in electrical connection with a different pin of a DUT.

FIG. 2 shows an electronic circuit or board tester with three tester circuits 10a, 10b and 10c as shown in FIG. 1. Each circuit tester 10a, 10b, 10c is connected with a different electrical connection 18a, 18b and 18c, such as a pin, of the electronic device DUT to be tested. A common clock means 30 is connected with each of the tester circuits 10a, 10b and 10c and its electronic devices via an electrical connection 31, such as a wire.

As every pin or electrical connection 18a, 18b and 18c of the DUT is associated with its own tester circuit, comprising a sequencer 11 and a vector-sequencer-memory 12, a different test-data-sequence can be forwarded to the associated electrical connection of the DUT or to the associated comparator of each tester Circuit 10a, 10b and 10c.

FIG. 3 shows a matrix comprising test patterns or test-data-sequences of a binary counter (not shown) with 5 electrical connections or pins. Of course any other digital electronic DUT could be tested with the electronic circuit or board tester according to the invention.

The matrix in FIG. 3 comprises 20 rows (1 to 20) which are called test vectors. Each test vector shows the signals on all 5 pins of the binary counter at one clock cycle. The left column of the matrix "Clk" shows the signal at the clock pin of the binary counter DUT during each of the 20 cycles. Symbol "0" means low-voltage-level, "1" means high-voltage-level. The clock signal shown in the left column of the matrix is a return to zero signal, i.e. that high-voltage-level "1" is applied to the clock pin of the DUT only as a short voltage pulse.

The next columns Qa to Qd are the output pins of the common binary counter. When studying the output data-sequence of pin Qb one will see that data string "0011" repeatedly exists in the output data-sequence.

For the test of the binary counter, five tester circuits according to the invention are used. One for the clock-input-pin and four tester circuits for the output pins. Commonly, a binary counter comprises more than 5 pins. But for better understanding of the present invention only the five mentioned pins have been considered.

Without compressing the test-data-sequence to be applied to the clock-input of the binary counter, one needs:

1 sequencer instruction+20 Vectors=28 vectors memory space in the tester circuit of the associated clock input of the binary counter. For the storage of one sequencer instruction eight vectors of memory space are necessary. If one has a look at the test-data-sequence to be applied to the clock input it is easy to be seen that the tester circuit applies 20-times a high-voltage-level "1" to the clock pin of the counter. A data processor according to the invention checks this test-data-sequence and generates one decompress sequencer instruction. The decompress sequencer instruction of the data processor is stored in the memory of the tester circuit according to the invention. Further, the data processor generates a compressed test-data-sequence. In this specific case, the .compressed test-data-sequence is only one data string ("1") being repeatedly existing in the test-data-sequence. Thus:

1 decompress sequencer instruction+1 vector=9 vectors memory space are only needed.

To generate the test-data-sequence of the output pin Qb by a test circuit (without using a compression technique according to the invention) one needs 28 vectors memory space. This is the same amount for storing the uncompressed test-data-sequence to be applied to the clock input of the binary counter.

The data processor according to the invention recognizes that the data string "0011" is repeated five times in the output-data-sequence of pin Qb. To generate such test-data-sequence to be applied to a comparator comparing the test-data-sequence with the output-data-sequence, the data processor generates a decompress sequencer instruction instructing the sequencer of the tester to repeat a data string five times. Further, the data processor generates the data string "0011" being the compressed test-data-sequence. For storage:

1 decompress sequencer instruction+4 vectors=12 vectors memory space in the memory of the tester circuit for pin Qb are needed.

It will be understood that also a decompress sequencer instruction for generating the data string "00" and another decompress sequencer instruction for generating the repeatedly existing data string "11" could be used. Then, the necessary memory space is:

1 decompress sequencer instruction+1 vector=9 vectors

+1 decompress sequencer instruction+1 vector=9 vectors for data strings "00" and "11". As the output-data-sequence of Pin Qb comprises five such strings, (5×18=)80 vectors would be needed in total.

This shows that such compression would need 68 vectors more memory space. The data processor according to the invention checks the different opportunities to compress the test-data-sequence and chooses by comparison the compression needing minimal memory space.

FIGS. 4A–E show the compression of a test-data-sequence being performed by the data processor in more detail. In this example the data processor according to the invention compresses only data strings following each other immediately.

For example, the test-data-sequence is:

101X101X101X101X1111111111101010101010101

In FIG. 4A the data processor loads the first two digits "10" of the test-data-sequence and checks whether this data string is repeated immediately in the third and fourth digit of the test-data-sequence. As it is not the case, the data processor loads a further digit, the third digit "1" and compares whether the data string "101" is repeated immediately at the fourth digit of the test-data-sequence (FIG. 4B). As it is not the case, the data processor loads a further digit, the fourth digit "X" (FIG. 4C). Then the data processor compares whether this data string "101X" repeatedly exists in the test-data-sequence. As will be seen, this is four times the case. The data processor generates a decompress sequencer instruction. This instruction is an instruction to operate the sequencer of the specific tester circuit repeating a set of four vectors four times. Further, the data processor generates four vectors being the repeated data string "101X". The decompress sequencer instruction and the four vectors are stored in a vector-sequencer-memory of the specific tester circuit, such as in a tester circuit 10 shown in FIG. 1. "X" is a vector indicating that this digit shall not be compared by the comparator in the tester circuit. For certain reasons, such digit "X" is used in a test-data-sequence.

In FIG. 4D the data processor checks the next part of the test-data-sequence joined together. The data processor loads the first digit "1" of the next part of the test-data-sequence beginning after the first already compressed part and compares the loaded digit "1" with the next part of the test-data-sequence at a position indicated as "start". The data processor recognizes that data string "1" is repeated eleven times beginning with the seventeenth digit. The data processor generates a further decompress sequencer instruction and one vector "1". Both are also stored in the vector-sequencer-memory of the tester circuit being associated with the specific pin of the DUT.

In FIG. 4E the data processor checks the last part of the test-data-sequence with regard to redundancy. After loading the first two digits of the test-data-sequence "01", the data processor recognizes by aid of a comparator or a comparison process that the data string "01" is repeated seven times. The data processor generates a decompress sequencer instruction and two vectors for the data string "01". When the sequencer of the tester circuit is operated by this decompress sequencer instruction, the sequencer will generate the data string "01" immediately one after the other. A decompress sequencer instruction and the two vectors "01" are also stored in the vector-sequencer-memory of the tester circuit of the specific pin to be tested with the test-data-sequence shown in FIGS. 4A–E.

As described in FIGS. 4A–E the test-data-sequence comprising 41 digits is compressed by the data processor according to the invention to three decompress sequencer instructions and seven vectors (4+1+2). In total 31 vectors are needed to describe a test-data-sequence with 41 digits. For storing the uncompressed test-data-sequence 41 vectors would have been needed.

FIG. 5 shows the compression of another test-data-sequence by compressing identical data strings in it which

9 do not follow each other immediately. In the example shown in FIG. 5 only the compression of the most frequent data string in the test-data-sequence is explained. It will be understood that also less frequent repeatedly existing data strings in the test-data-sequence could be compressed accordingly.

The test-data-sequence in FIG. 5 is:

101X000101X1111101X101010101X000101X1010101X010

By loading one digit after the other in the data processor according to the invention and checking how often the current already loaded data string appears in the test-data-sequence, the data processor determines that the data string "101X" is the most frequent repeatedly existing data string in the test-data-sequence of FIG. 5. The data string "101X" occurs six times in the test-data-sequence.

The data processor substitutes the data string "101X" by an access instruction "T". From FIG. 5 it will be seen that a test-data-sequence comprising the access instructions "T" is much shorter than the uncompressed test-data-sequence. The compressed test-data-sequence is stored in the vector-sequencer-memory of the tester circuit of the specific pin. When the sequencer of the tester circuit loads the compressed test-data-sequence comprising the access instructions "T", the sequencer accesses to vector-sequencer-memory storing the data string "101X" and substitutes each access instruction "T" in the compressed test-data-sequence by the stored data string "101X" and thereby generates the decompressed test-data-sequence.

We claim:

1. An electronic circuit or board tester for testing an electronic device (DUT) comprising a plurality of tester circuits, each comprising:

a conductor for providing an electrical connection to said electronic device (DUT) to be tested;

a first memory for storing at least a compressed test-data-sequence;

a first comparator;

a sequencer connected to said first memory via an address bus and a data bus for controlling decompression of a compressed test-data-sequence to produce a decompressed test-data-sequence, and for transferring said decompressed test-data-sequence to said electronic device (DUT) or to said first comparator which compares response data of said electronic device (DUT) with said decompressed test data;

each tester circuit electrically connected with one electrical connection of said electronic device (DUT) to be tested; and a clock means for applying a timing signal to said sequencer.

2. An electronic circuit or board tester as in claim 1, further comprising:

a data processor for checking a test-data-sequence to be transferred to said one electrical connection of said electronic device (DUT) to be tested or to said first comparator, with regard to a data string that is repeated in said test-data-sequence, said data processor generating sequencer instructions and said compressed test-data-sequence, said sequencer instructions being operating instructions which control said sequencer to decompress said compressed test-data-sequence to said test-data-sequence.

3. An electronic circuit or board tester as in claim 2, wherein said sequencer instructions are stored in said first memory or in a second memory of said tester circuit.

10

4. An electronic circuit or board tester as in claim 2 wherein said data string that is repeated in said test-data-sequence is stored only once in said first memory, and said sequencer instructions comprise an instruction to repeat said data string whenever necessary to generate said test-data-sequence on a basis of said compressed test-data-sequence.

5. An electronic circuit or board tester as in claim 4, wherein said sequencer instructions comprise at least two access instructions to load the once stored data string sequentially in a memory of said sequencer.

6. An electronic circuit or board tester as in claim 2, further comprising:

a second comparator for checking whether said storage of said repeated data string and said sequencer instruction to repeat said data string whenever necessary to generate said test-data-sequence requires more memory space than the storage of the decompressed repeated data strings.

7. An electronic circuit or board tester as in claim 1, wherein each of said sequencers of said tester circuits operates independently of other of said sequencers, except for said timing signal.

8. An electronic circuit or board tester as in claim 1, wherein each of said first memories comprises a RAM.

9. An electronic circuit or board tester as in claim 1, wherein each of said sequencers comprises a sequencer storage unit, a sequencer directory, and a sequencer controller.

10. A method of testing an electronic device (DUT) comprising the steps of:

a first step in which a decompressed test-data-sequence to be applied to one electrical connection of said electronic device (DUT) to be tested is compressed into a compressed test-data-sequence by a data processor for generating sequencer instructions;

a second step in which said compressed test-data-sequence and said sequencer instructions of said sequencer are stored in at least a first memory that is connected with each said sequencer via an address bus and a data bus;

a third step in which said sequencer is operated by said sequencer instructions to decompress said compressed test-data-sequence; and a fourth step in which said decompressed test-data-sequence is transferred to said one electrical connection of said electronic device (DUT) to be tested or to a comparator which compares response data of said electronic device (DUT) with said decompressed test-data-sequence.

11. A method of testing an electronic device (DUT) as in claim 10, wherein said decompressed test-data-sequence is checked to determine if a data string is repeated in said decompressed test-data-sequence and said data string is stored only once or at least less times than it is repeated in said first memory.

12. A method of testing an electronic device (DUT) as in claim 11 where, in said compression of said test-data-sequence, said repeated data string is eliminated from said test-data-sequence and a first sequencer instruction is added to already existing sequencer instructions controlling operation of said sequencer such that said sequencer is operated by said sequencer instruction and already existing sequencer instructions that generate said decompressed test-data-sequence or said already existing sequencer instructions are modified accordingly.

13. A method of testing an electronic device (DUT) as in claim 11 where, in said compression of said test-datasequence said repeated data string is replaced by an access instruction, such compressed test-data-sequence is stored in said first memory, said data string is stored in said first memory or a second memory, said sequencer when loading said compressed test-data-sequence sequentially for decompression, checking the existence of said access instruction and in case of said existence, loading said data string and inserting said data string in order to obtain said decompressed test-data-sequence to be applied to one electrical connection of said electronic device (DUT) to be tested or to said comparator comparing response data of said electronic device (DUT) with said decompressed test-data-sequence.

14. A method of testing an electronic device (DUT) as in claim 12 where a second comparator checks whether said first sequencer instruction that is added to said already existing sequencer instructions requires more memory space than is required for storage of said repeated data strings.

* * * * *